(12) United States Patent
Chen et al.

(10) Patent No.: US 7,881,094 B2
(45) Date of Patent: Feb. 1, 2011

(54) VOLTAGE REFERENCE GENERATION FOR RESISTIVE SENSE MEMORY CELLS

(75) Inventors: Yiran Chen, Eden Prairie, MN (US); Hai Li, Eden Prairie, MN (US); Harry Hongyue Liu, Maple Grove, MN (US); KangYong Kim, Boise, ID (US); Henry F. Huang, Apple Valley, MN (US)

(73) Assignee: Seagate Technology LLC, Scotts Valley, CA (US)

(*) Notice: Subject to any disclaimer, the term of this patent is extended or adjusted under 35 U.S.C. 154(b) by 206 days.

(21) Appl. No.: 12/269,598

(22) Filed: Nov. 12, 2008

(65) Prior Publication Data

US 2010/0118588 A1 May 13, 2010

(51) Int. Cl.
*G11C 11/00* (2006.01)
(52) U.S. Cl. ............ 365/148; 365/100; 365/210.1; 365/210.14; 365/189.04; 365/97
(58) Field of Classification Search .......... 365/148, 365/100, 210.1, 210.14, 189.04, 97, 48, 50
See application file for complete search history.

(56) References Cited

U.S. PATENT DOCUMENTS 6,563,743 B2   5/2003  Hanzawa et al.
6,847,561 B2   1/2005  Hashimoto et al.
2005/0063213 A1* 3/2005  Jacob et al. ............ 365/145

OTHER PUBLICATIONS

M. Hosomi, H. Yamagishi, T. Yamamoto, K. Bessho, Y Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," 2005, pp. 1-4, 0-7803-9269-8, IEEE, Japan.

* cited by examiner

*Primary Examiner*—Thong Q Le
(74) *Attorney, Agent, or Firm*—Fellers, Snider, et al.

(57) ABSTRACT

Various embodiments of the present invention are generally directed to an apparatus and associated method for generating a reference voltage for a resistive sense memory (RSM) cell, such as an STRAM cell. A dummy reference cell used to generate a reference voltage to sense a resistive state of an adjacent RSM cell. The dummy reference cell comprises a switching device, a resistive sense element (RSE) programmed to a selected resistive state, and a dummy resistor coupled to the RSE. A magnitude of the reference voltage is set in relation to the selected resistive state of the RSE and the resistance of the dummy resistor.

20 Claims, 7 Drawing Sheets

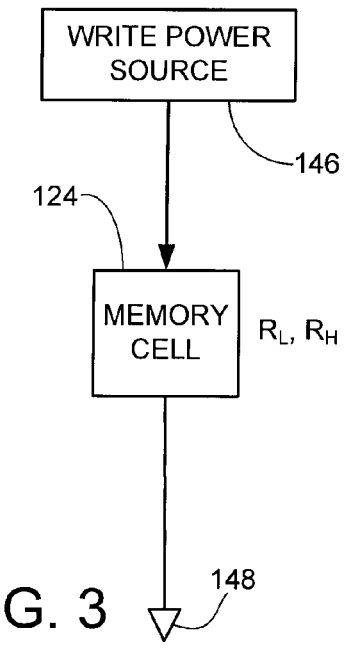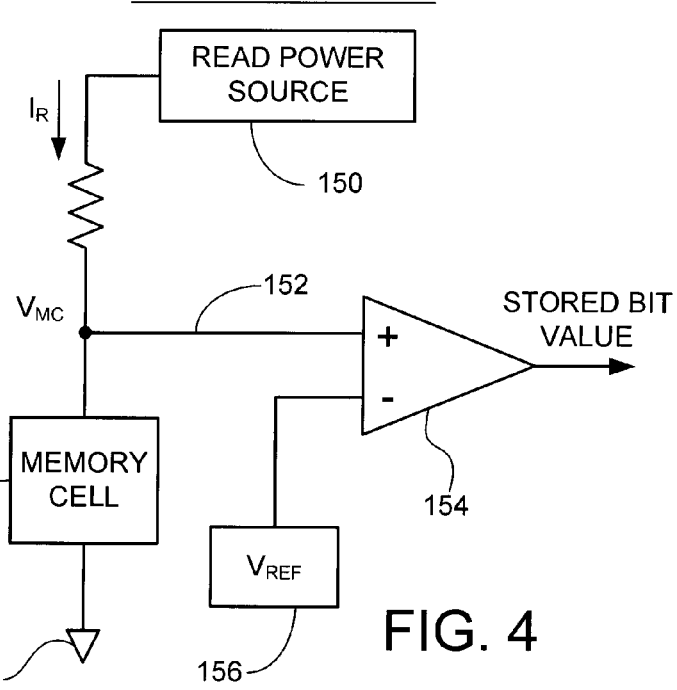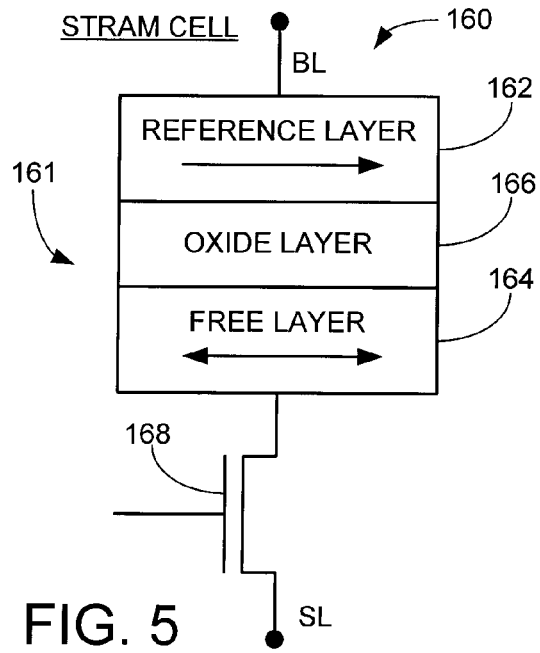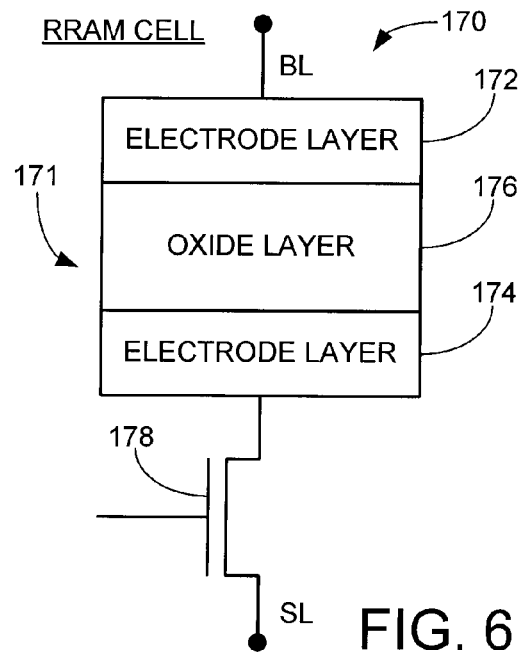

VOLTAGE REFERENCE GENERATION FOR RESISTIVE SENSE MEMORY CELLS

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power. Non-volatile memory cells can take a variety of constructions, such as spin-torque transfer random access memory (STTRAM or STRAM), resistive random access memory (RRAM), magnetic random access memory (MRAM), etc.

In these and other types of data storage devices, the cells can be configured to have different electrical resistances to store different logical states. The resistance state of a particular cell can be detected during a read operation by applying a read current, sensing a voltage drop across the cell, and comparing the sensed voltage drop with a reference voltage.

SUMMARY

Various embodiments of the present invention are generally directed to an apparatus and associated method for generating a reference voltage for a resistive sense memory (RSM) cell, such as an STRAM cell.

In accordance with some embodiments, an apparatus generally comprises a dummy reference cell used to generate a reference voltage to sense a resistive state of a resistive sense memory cell. The dummy reference cell comprises a switching device, a resistive sense element (RSE) programmed to a selected resistive state, and a dummy resistor coupled to the RSE. A magnitude of the reference voltage is set in relation to the selected resistive state of the RSE and the resistance of the dummy resistor.

In accordance with other embodiments, an apparatus generally comprises a dummy reference cell used to generate a reference voltage to sense a resistive state of a resistive sense memory (RSM) cell, the dummy reference cell comprising a switching device and a resistive sense element (RSE) programmed to a selected resistive state, wherein the dummy reference cell switching device is sized to have a resistance that is different from a resistance of a switching device of the RSM cell, further wherein a magnitude of the reference voltage is set in relation to the selected resistive state of the RSE and the resistance of the dummy reference cell switching device.

In accordance with other embodiments, a method generally comprises providing a dummy reference cell comprising a switching device, a resistive sense element (RSE) programmed to a first selected resistive state, and a dummy resistor coupled to the RSE. A current is passed through the dummy reference cell to generate a reference voltage, wherein a magnitude of the reference voltage is set in relation to the selected resistive state of the RSE and the resistance of the dummy resistor. The reference voltage is used to sense a second selected resistive state of a resistive sense memory cell.

These and various other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data are written to a memory cell of the memory array.

FIG. 4 generally illustrates a manner in which data are read from the memory cell of FIG. 3.

FIG. 5 shows an exemplary construction for a spin-torque transfer random access memory (STTRAM or STRAM) cell.

FIG. 6 shows an exemplary construction for a resistive random access memory (RRAM) cell.

DETAILED DESCRIPTION

Figure 1:
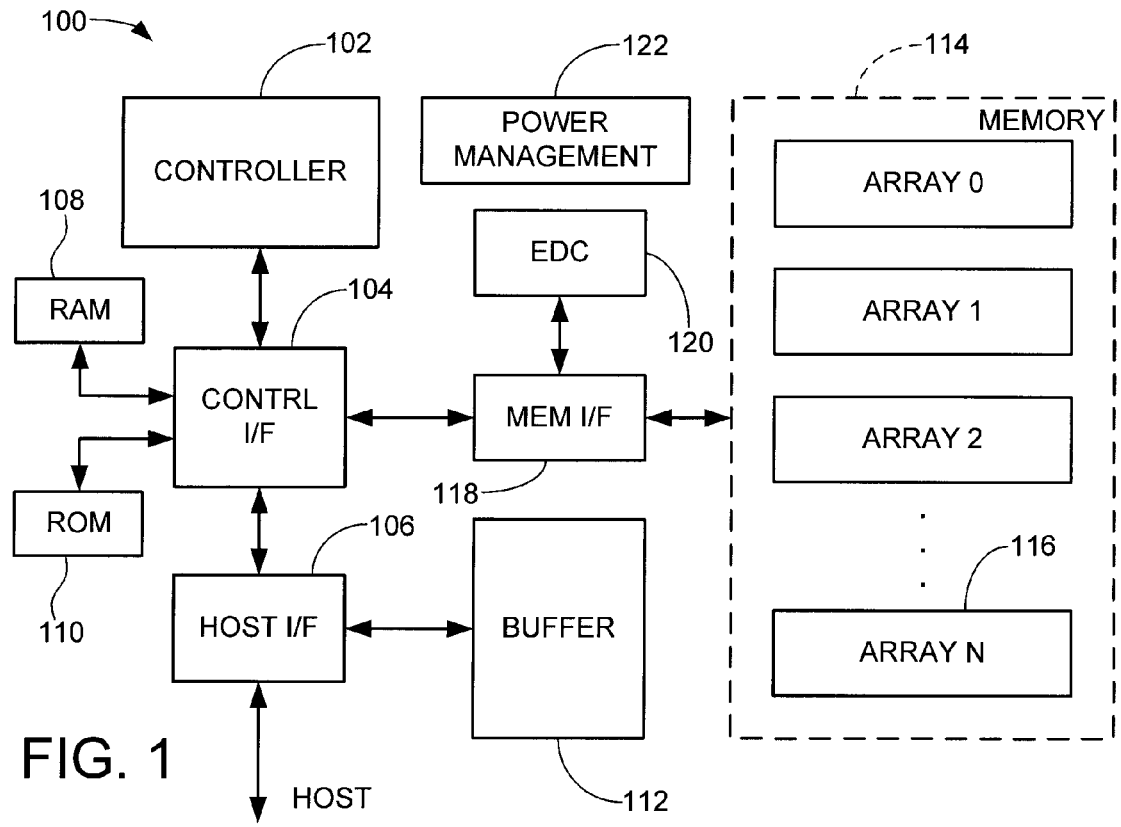
FIG. 1 is a functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustration and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device, as well as to facilitate serialization/deserialization of the data during a transfer operation. The buffer can be located in any suitable location, including in a portion of the array.

A memory space is shown at 114 to comprise a number of memory arrays 116 (denoted Array 0-N), although it will be appreciated that a single array can be utilized as desired. Each array 116 preferably comprises a block of semiconductor memory of selected storage capacity. Communications between the controller 102 and the memory space 114 are coordinated via a memory (MEM) I/F 118. As desired, onthe-fly error detection and correction (EDC) encoding and decoding operations are carried out during data transfers by way of an EDC block 120.

While not limiting, in an embodiment the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
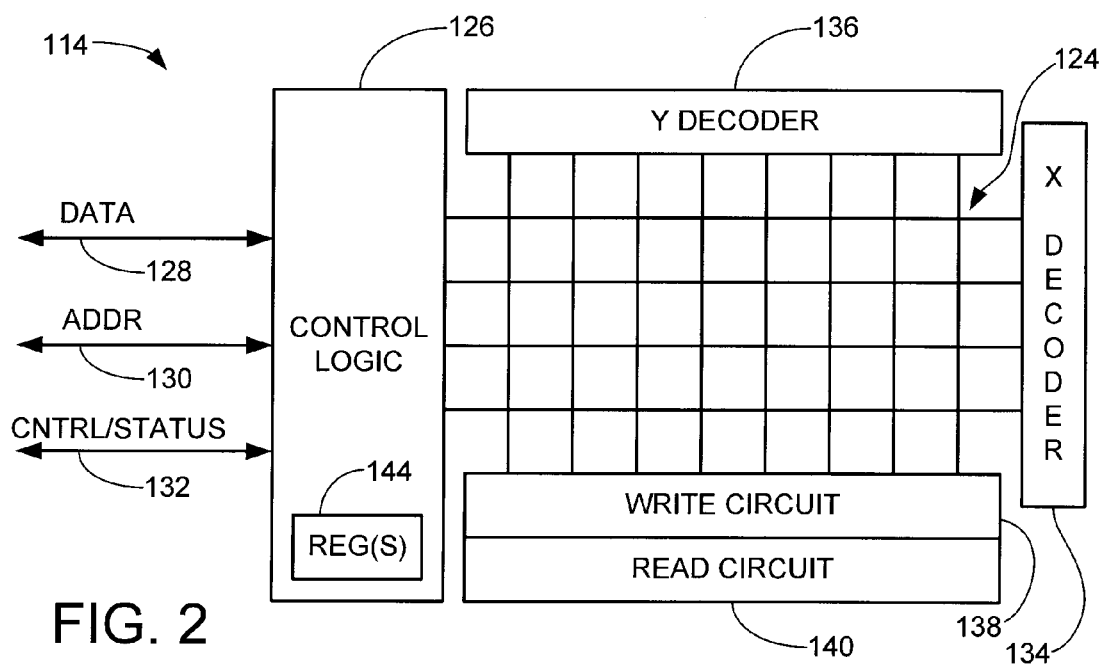
FIG. 2 shows circuitry used to read data from and write data to a memory array of the device of FIG. 1.

FIG. 2 provides a representation of selected aspects of the memory space 114 of FIG. 1. Data are stored as an arrangement of rows and columns of memory cells 124, accessible by various row (word) and column (bit) lines, etc. In an embodiment, each of the array memory cells 124 has a spin-torque transfer random access memory (STTRAM or STRAM) configuration. However, it will be appreciated that such is not limiting, in that any number of different types of non-volatile or volatile memory cell constructions may be utilized, including but not limited to resistive RAM (RRAM), magnetoresistive RAM (MRAM), zero-capacitor RAM (ZRAM), static RAM (SRAM), non-volatile static RAM (nvSRAM), ferroelectric RAM (FeRAM), nano RAM (NRAM), phase-change RAM (PRAM), EEPROM, flash, dynamic RAM (DRAM), etc.

The actual configurations of the cells and the access lines thereto will depend on the requirements of a given application. It is contemplated that the various control lines will include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. The circuitry of FIG. 2 is merely exemplary in nature, as any number of alternative configurations can readily be employed as desired depending on the requirements of a given application.

Data are written to the respective memory cells 124 as generally depicted in FIG. 3. A write power source 146 applies the necessary input (such as in the form of current, voltage, magnetization, etc.) to configure the memory cell 124 to a desired state. The configuration of the write power source 146, memory cell 124, and reference node 148 can be suitably manipulated to allow conventional writing of a bit with a variety of memory devices (such as SRAM, STRAM, RRAM, flash, etc).

As noted above, in an embodiment the memory cell 124 takes an STRAM configuration, in which case the write power source 146 is preferably characterized as a bi-directional current driver connected through a memory cell 124 to a suitable reference node 148, such as ground. The write power source 146 preferably provides a stream of power that is spin polarized by moving through a magnetic material in the memory cell 124. The resulting rotation of the polarized spins creates a torque that changes the magnetic moment of the memory cell 124.

Depending on the orientation of the applied write current, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100 K$\Omega$ or so Other resistive memory type configurations (e.g., RRAMS) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). In the case of STRAM, as well as other types of memory configurations such as RRAM, the read current magnitude will be significantly lower than the write current magnitude utilized to set the storage state of the bit. The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ is preferably selected such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

In some embodiments, the memory cells 124 are characterized as so-called resistive sense memory (RSM) cells. As used herein, RSM cells are described as cells configured to have different electrical resistances which are used to store different logical states. The resistance of the cells can be subsequently detected during a read operation by applying a read current and sensing a signal in relation to a voltage drop across the cell. Exemplary types of RSM cells include STRAM, RRAM, magnetic random access memory (MRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

FIG. 5 shows an exemplary STRAM cell 160. The STRAM cell 160 includes a magnetic tunneling junction (MTJ) 161 formed from two ferromagnetic layers 162, 164 separated by an oxide barrier layer 166 (such as magnesium oxide, MgO). The resistance of the MTJ 161 is determined in relation to the relative magnetization directions of the ferromagnetic layers 162, 164: when the magnetization is in the same direction, the MTJ is in the low resistance state ($R_L$); when the magnetization is in opposite directions, the MTJ is in the high resistance state ($R_H$).

In some embodiments, the magnetization direction of the reference layer 162 is fixed by coupling to a pinned magnetization layer (e.g., a permanent magnet, etc.), and the magnetization direction of the free layer 164 can be changed by passing a driving current polarized by magnetization in the reference layer 162.

To read the logic state stored by the MTJ 161, a relatively small current is passed through the MTJ between a source line (SL) and a bit line (BL). Because of the difference between the low and high resistances of the MTJ 161 in the respective logical 0 and 1 states, the voltage at the bit line will be different, which can be sensed using a suitable sense amplifier. A switching device 168 allows selective access to the MTJ 161 during read and write operations.

FIG. 6 illustrates an RRAM cell 170 as an alternative RSM cell construction. The RRAM cell 170 provides a resistive sense element 171 with opposing electrode layers 172, 174 and an oxide layer 176. The oxide layer 176 may be configured to have a nominally high resistance (e.g., $R_H$). The resistance of the oxide layer, however, can be lowered (e.g., $R_L$) through application of a relatively high write voltage across the RRAM cell 170. Such voltage generates lower resistance paths (filaments) as components of a selected electrode layer 172, 174 migrate into the oxide layer 176.

The oxide layer 176 can be restored to its original, higher resistance through application of a corresponding voltage of opposite polarity. As with the STRAM cell 160 of FIG. 5, the storage state of the RRAM cell 170 of FIG. 6 can be read by passing a read current from a source line (SL) to a bit line (BL), and sensing the resistance of the cell in a manner such as shown in FIG. 4. A switching device 178 facilitates access to the RRAM cell.

Figure 7:
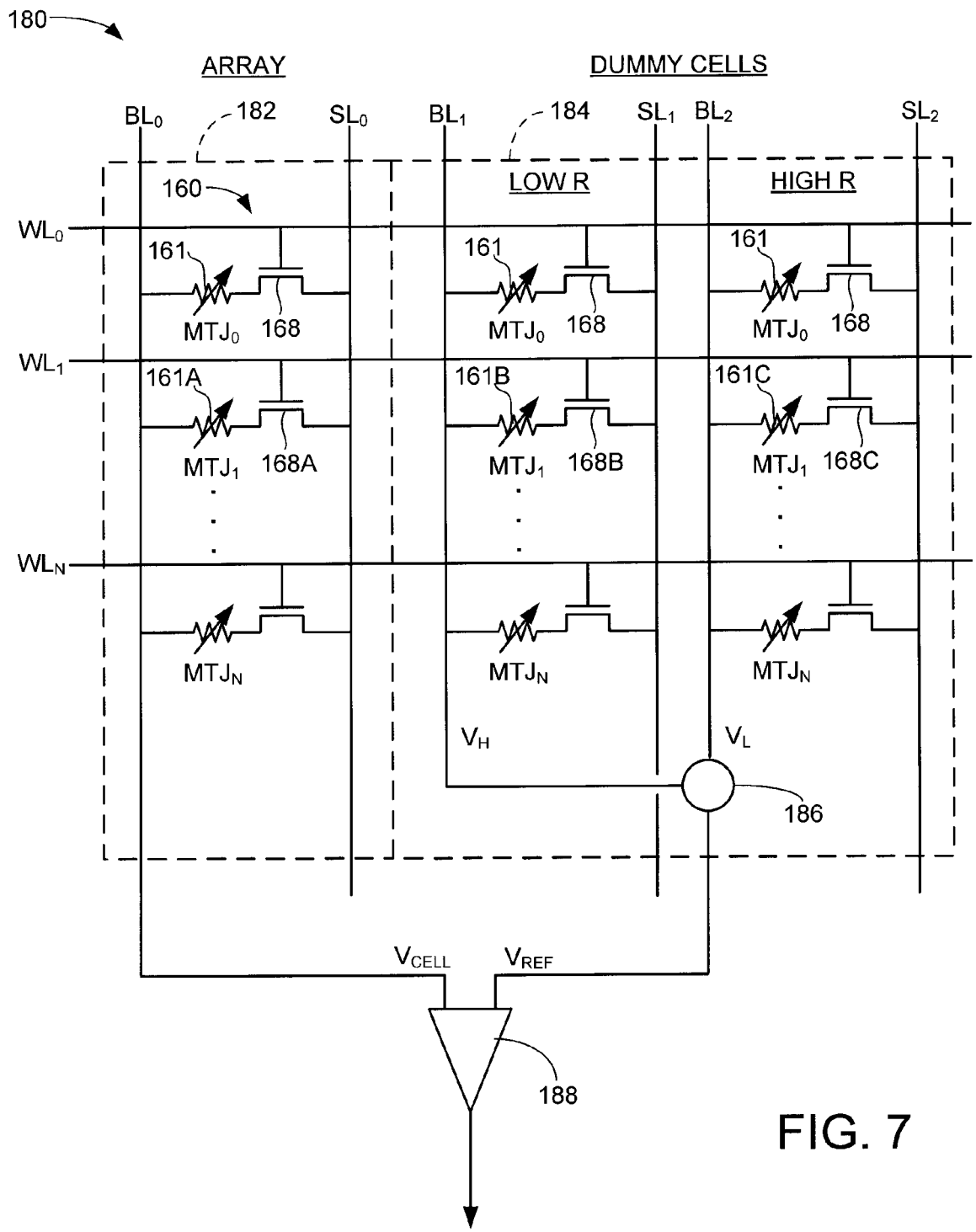
FIG. 7 provides a schematic representation of the use of dummy cells to generate a reference voltage.

FIG. 7 shows an exemplary memory circuit 180 formed of STRAM cells 160 as set forth in FIG. 5. The memory circuit 180 includes an array portion 182 and a dummy cell portion 184. While only a single column of STRAM cells 160 is shown in the array 182 in FIG. 7, the array can be alternatively configured to have a larger number of adjacent columns of cells which can be alternatively selected as desired. The column of STRAM cells 160 in the array 182 constitutes a total number of N cells with MTJs denoted $MTJ_0$ to $MTJ_N$.

The dummy cell portion 184 includes two columns of STRAM cells 160, each also having a total number of N dummy cells. The dummy cells are used to generate suitable reference voltage values during a read operation upon the memory cells in the array 182. The MTJs in the first column ("LOW R") of the dummy cell portion 184 are each programmed to the low resistance (RL) state, and the MTJs in the second column ("HIGH R") of the dummy cell portion 184 are each programmed to the high resistance (RH) state.

A number of control lines provide access to the respective cells in the array 182 and the dummy cell portion 184. These control lines include word lines WL0, WL1 and WL2; bit lines BL0, BL1 and BL2; and source lines SL0, SL1 and SL2.

The word lines extend across the memory circuit 180 to place selected memory array cells and dummy reference cells into individually selectable rows.

An exemplary read operation upon a selected STRAM cell 160 in the array 182 will now be described. For this discussion, it will be contemplated that this read operation will determine the resistive state of $MTJ_1$ in the array 182. The reading of the remaining MTJs in the array 182 are carried out in a similar fashion. For reference, the $MTJ_1$ cell in the array 182 is numerically denoted herein as 161A. The corresponding $MTJ_1$ cells in the dummy reference portion 184 are correspondingly denoted herein as 161B and 161C.

Suitable control circuitry (such as depicted in FIG. 2) operates to place a suitable read voltage on bit line BL0, and connects source line SL0 to a suitable level, such as ground. Similar configurations are made for the bit lines BL1, BL2 and source lines SL1 and SL2 of the dummy reference portion 184. The word line WL1 is next asserted, allowing respective read currents to be respectively passed through the MTJs 161A-C.

The output of the memory cell provides a voltage $V_{CELL}$ indicative of the voltage drop across the $MTJ_1$ 161A in the array 182. The voltage $V_{CELL}$ will vary in relation to the programmed resistive state of the MTJ (i.e., logical 0 or 1). The dummy reference array will output a high voltage $V_H$ in relation to the programmed state of $MTJ_1$ 161B and a low voltage $V_L$ in relation to the $MTJ_1$ 161C programmed state. The respective voltages $V_H$ and $V_L$ are combined at summing junction 186 to provide a reference voltage $V_{REF}$, as follows:

$$V_{REF} = \frac{(V_H + V_L)}{2} \quad (1)$$

The $V_{CELL}$ voltage is compared to the $V_{REF}$ voltage by a sense amplifier 188 to output a data bit value corresponding to the logical state of the MTJ1 161A as discussed above in FIG. 4. Ideally, the $V_{REF}$ value will be a suitable value between the $V_H$ and $V_L$ levels (also referred to as the "$V_{MAX}$" and "$V_{MIN}$" values) so that accurate determinations of the storage states of the memory cells can be made.

While the use of dummy cells to generate reference voltages as in FIG. 7 has been found operable, a limitation with these and other reference voltage generation approaches relates to variations that can arise in the respective resistances of the memory cells. Such variations can arise due to a number of factors, including variability as a result of manufacturing processing during device fabrication. The $V_{CELL}$ voltage output on the bit line BL0 in FIG. 7 can be generally expressed as:

$$V_{CELL} = I_R(R_{CELL} + R_{TR}) \quad (2)$$

where $I_R$ is the read current, $R_{CELL}$ is the resistance of the associated MTJ 161, and $R_{TR}$ is the resistance of the associated switching device (transistor) 168. $R_{TR}$ is the forward biased drain-source resistance of the transistor, and will usually be a relatively low value (e.g., on the order of a few hundred ohms Ω or less, depending on the size of the transistor.). As noted above, the $R_{CELL}$ value may be low ($R_L$ or "$R_{MIN}$") or high ($R_H$ or "$R_{MAX}$") depending on the programmed state of the cell, and these respective values can vary significantly. It will be noted from equation (2) that variations in the magnitude of read current $I_R$ can also contribute to variations in the sensed cell voltage $V_{CELL}$.

These variation effects can be present not only for memory cells being read (such as the $MTJ_1$ 161A in FIG. 7), but also for dummy cells used to generate the reference voltage $V_{REF}$ (such as dummy cells $MTJ_1$ 161B and 161C in FIG. 7) during the read operation. Depending on the respective variation distributions, a generated $V_{REF}$ may be greater than the $V_{MAX}$ value or less than the $V_{MIN}$ value for a given memory cell, preventing accurate determination of the storage state of the cell being read.

Figure 8:
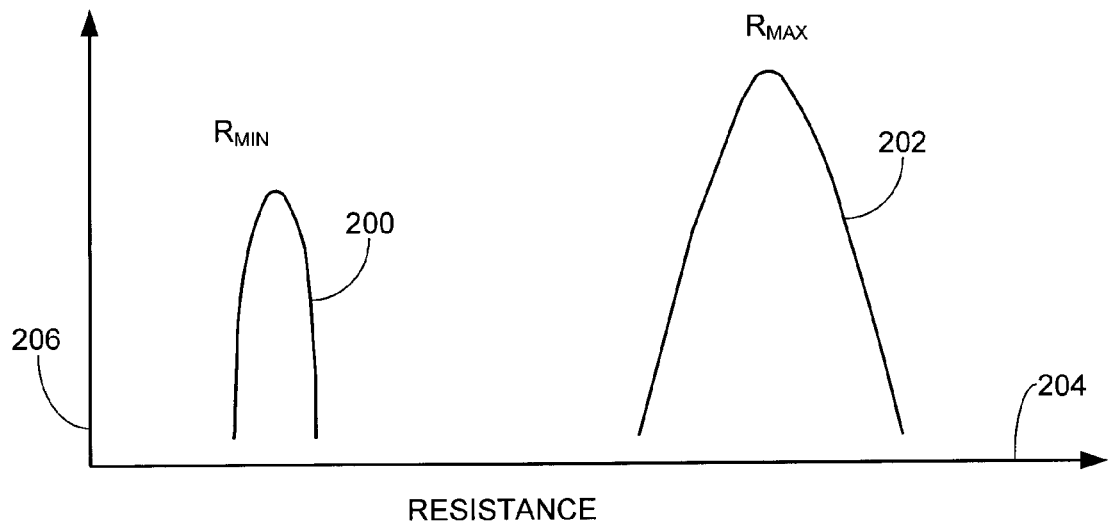
FIGS. 8 and 9 respectively show resistance and voltage characteristics for the circuitry of FIG. 7.

FIG. 8 provides a graphical representation of exemplary cell resistance variation curves 200 and 202, plotted against a resistance x-axis 204 and an amplitude y-axis 206. The curves 200 and 202 represent distributions of $R_{MIN}$ and $R_{MAX}$ values for a population of RSM cells, such as the STRAM cells 160 in FIG. 7. Initially, it would appear that sufficient margin exists between the respective population curves 200, 202 to ensure proper voltage reference VREF generation.

Figure 9:
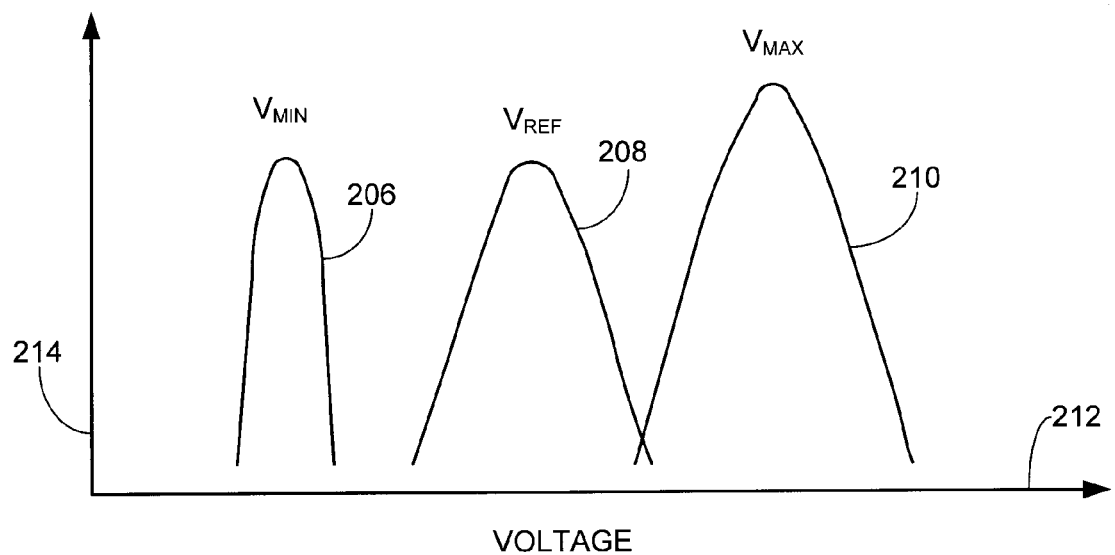

FIG. 9 demonstrates that this may not necessarily be the case. FIG. 9 provides corresponding voltage distribution curves 206, 208 and 210. The distribution curves 206, 208 and 210 are generally aligned with the resistance curves 200, 202 of FIG. 9, and are plotted against a voltage x-axis 212 and an amplitude y-axis 214. The voltage curve 206 corresponds to $V_{MIN}$ values derived from the $R_{MIN}$ values of curve 200. The voltage curve 210 corresponds to $V_{MAX}$ values derived from the $R_{MAX}$ values of curve 202. The voltage curve 208 corresponds to $V_{REF}$ values derived from the $V_{MIN}$ and $V_{MAX}$ values of curves 206 and 210.

As can be seen from the exemplary values of FIG. 9, the $V_{REF}$ distribution curve 208 has a relatively large standard deviation (sigma, or σ), and has a mean (x̂) positioned such that some amount of overlap exists with the adjacent $V_{MAX}$ curve 210. More generally, the various distributions of FIGS. 8-9 can be expressed as follows:

$$V_{MAX,MEAN} = I_R(R_{MAX,MEAN} + R_{TR}) \quad (3)$$

$$V_{MAX,SIGMA} = I_R(SIGMA_{MAX}) \quad (4)$$

$$V_{MIN,MEAN} = I_R(R_{MIN,MEAN} + R_{TR}) \quad (5)$$

$$V_{MIN,SIGMA} = I_R(SIGMA_{MIN}) \quad (6)$$

$$V_{REF,MEAN} = I_R\left(\frac{R_{MIN,MEAN}}{2} + \frac{R_{MAX,MEAN}}{2} + R_{TR}\right) \quad (7)$$

$$V_{REF,SIGMA} = I_R\left(\frac{SIGMA_{MIN}}{2}, \frac{SIGMA_{MAX}}{2}\right) \quad (8)$$

In the foregoing relations, $V_{MAX,MEAN}$, $V_{MIN,MEAN}$ and $V_{REF,MEAN}$ correspond to the respective mean values for $V_{MAX}$, $V_{MIN}$ and $V_{REF}$, respectively. $SIGMA_{MIN}$ and $SIGMA_{MAX}$ are the standard deviations of $R_{MIN}$ and $R_{MAX}$, respectively. $V_{MAX,SIGMA}$, $V_{MIN,SIGMA}$ and $V_{REF,SIGMA}$ are the standard deviations of $V_{MIN}$, $V_{MAX}$ and $V_{REF}$, respectively.

From FIGS. 8-9 and equations (3)-(8), it can be observed that there is a substantial amount of separation between the respective $R_{MIN}$ and $R_{MAX}$ distributions (i.e., greater than $6SIGMA_{MIN}$ and $6SIGMA_{MAX}$), and the $SIGMA_{MIN}$ value for the RMIN distribution is relatively low. Similar characteristics have been found to be present for other types of RSM cell constructions.

Accordingly, various embodiments of the present invention incorporate dummy resistance in a dummy reference cell to facilitate the generation of a reference voltage. In some embodiments, a passive resistor is added to the cell with a controlled resistance of $R_\Delta$ ($R_{DELTA}$), and the MTJ (or other programmable resistive element) of the cell is programmed to the low resistance ($R_{MIN}$) state. This enables generation of a voltage reference value $V_{REF}$, as follows:

$$V_{REF} = I_R(R_{MIN} + R_{DELTA} + R_{TR}) \quad (9)$$

The addition of the resistance value $R_\Delta$ ($R_{DELTA}$) results in a significant reduction in voltage reference value variation ($SIGMA_{REF}$), and allows a single dummy reference cell to be used to generate the reference voltage. An exemplary memory circuit which embodies this configuration is shown at 220 in FIG. 10.

Figure 10:
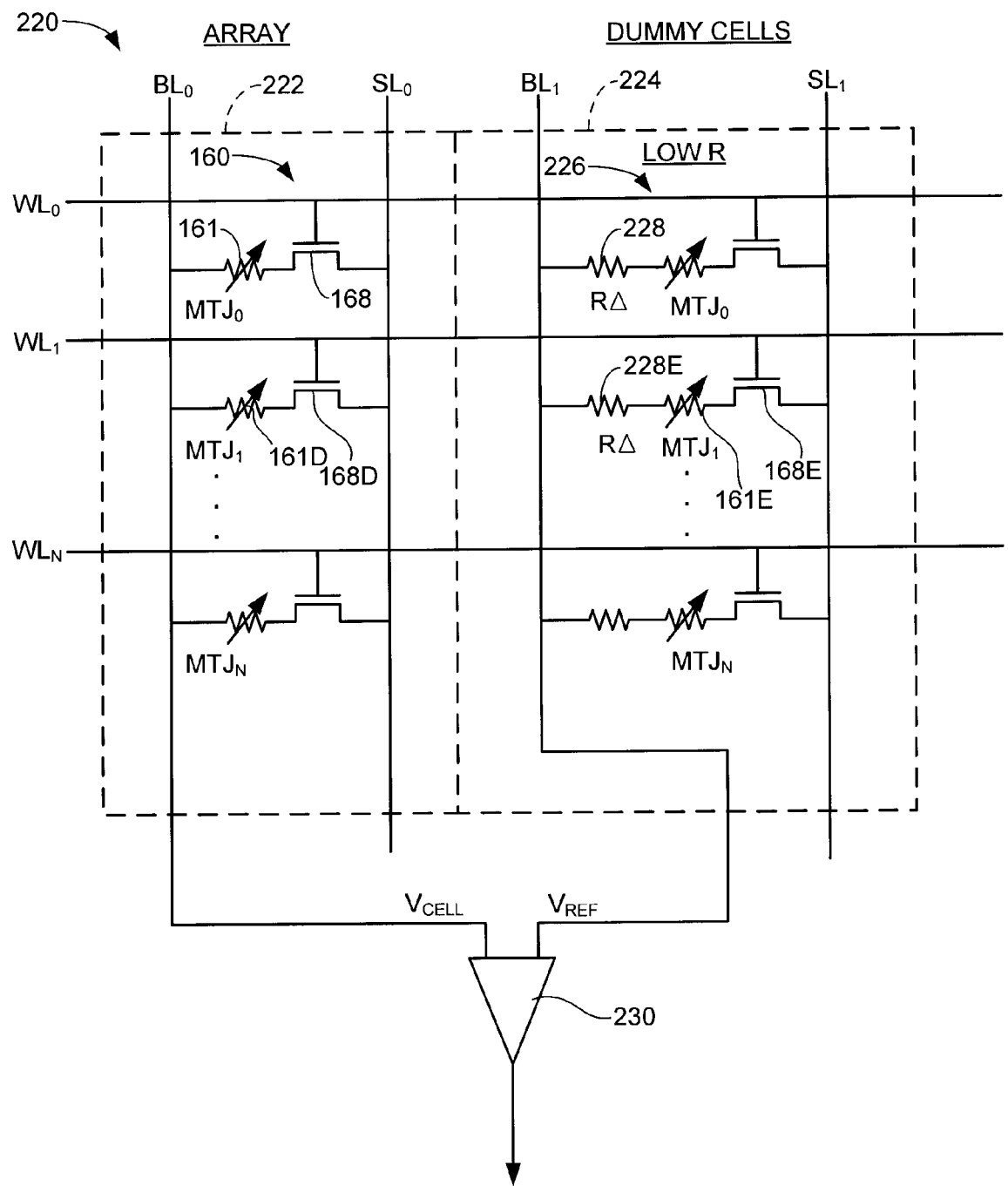
FIG. 10 shows a schematic representation of a circuit that uses dummy cells configured in accordance with preferred embodiments to generate a reference voltage.

FIG. 10 provides a memory array portion 222 and a dummy reference portion 224. The array 222 comprises a column of RSM cells (in this case, STRAM cells 160) with MTJs from $MTJ_0$ to $MTJ_N$. As before, multiple columns of memory cells can be provided and alternately selected in turn.

The dummy reference portion 224 in FIG. 10 includes a single column of dummy cells 226. Each dummy cell includes an MTJ 161, a switching device 168 and a dummy resistor 228. The MTJs 161 in the dummy cells 226 are also denoted from $MTJ_0$ to $MTJ_N$.

To read a selected MTJ in the array 222 (in this case, MTJ1 161D), respective read currents are applied to the bit lines $BL_0$ and $BL_1$. The source lines $SL_0$ and $SL_1$ are set to reference (e.g., ground), and the word line $WL_1$ is asserted. This induces a voltage $V_{CELL}$ on the bit line $BL_0$ in relation to the programmed resistance of $MTJ_1$ 161D, and induces a reference voltage $V_{REF}$ on the bit line $BL_1$ in accordance with equation (9) above. These respective voltages are compared by sense amplifier 230 to output a logical bit value corresponding to the programmed state of $MTJ_1$ 161D.

Figure 11:
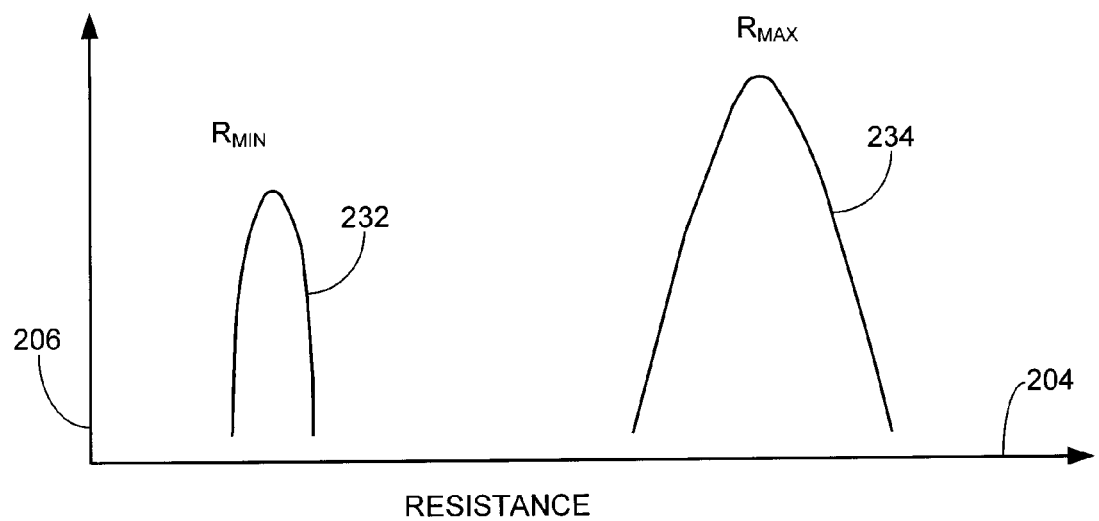
FIGS. 11 and 12 set forth graphical representations of resistance and voltage characteristics of the circuit of FIG. 10.
Figure 12:
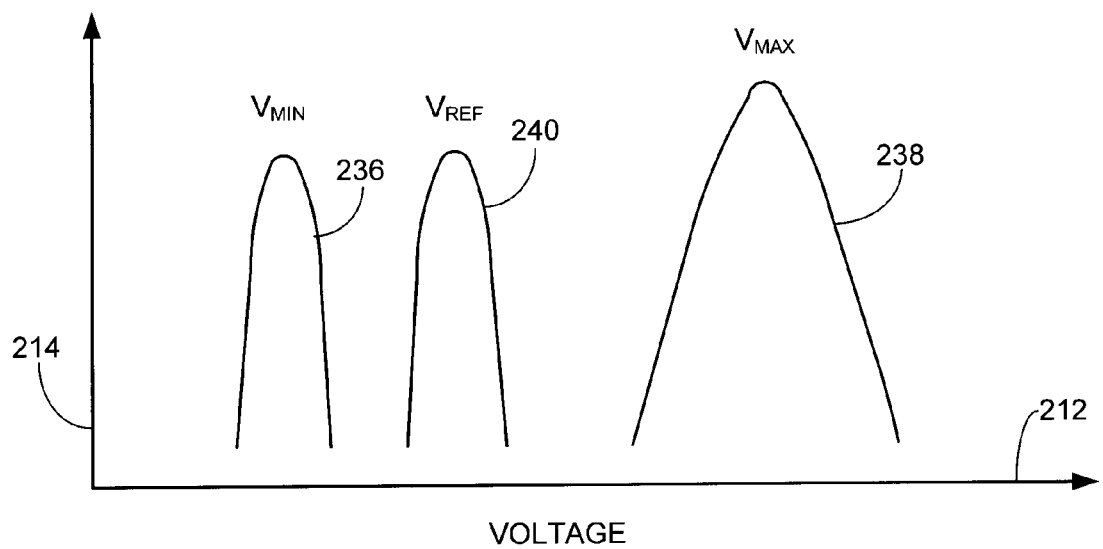

FIGS. 11 and 12 show corresponding resistance and voltage distribution characteristics for the circuit 220 of FIG. 10. FIG. 11 provides resistance distribution curves 232, 234 corresponding to the $R_{MIN}$ and $R_{MAX}$ populations of the MTJs 161 in circuit 220. It will be noted that the resistance distribution curves 232, 234 generally correspond to the curves 200, 202 in FIG. 8.

FIG. 12 provides corresponding curves 236, 238 to set forth corresponding $V_{MIN}$ and $V_{MAX}$ distributions for the MTJs 161. The voltage distribution curves 236, 238 also generally correspond to the curves 206, 210 in FIG. 9. A voltage reference $V_{REF}$ distribution curve 240 in FIG. 12, however, shows significant reduction in variation as compared to the VREF distribution curve 208 in FIG. 9.

While the embodiment of FIG. 10 uses a selected resistance RΔ so that the $R_{MIN}$ value is used (i.e., the MTJ 161E is set to low resistance), it will be appreciated that alternative configurations can be used. For example, in other embodiments the resistance $R_\Delta$ is selected such that the $R_{MAX}$ value can be used (i.e., the MTJ is set to high resistance). In still further embodiments, dual sets of modified dummy reference cells are used and combined to generate a reference voltage $V_{REF}$.

Figure 13:
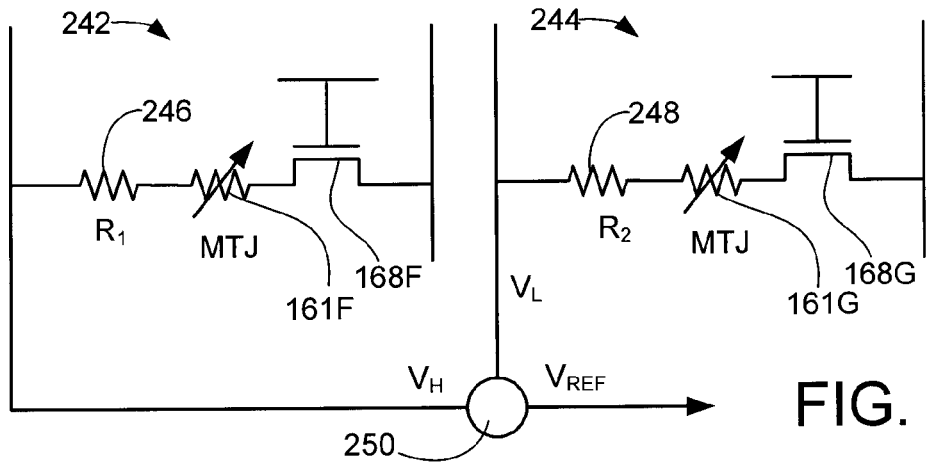
FIG. 13 provides a schematic representation of an alternative dummy cell construction which uses multiple dummy cells to generate a reference voltage.

An example of this latter configuration is represented in FIG. 13, which shows a first modified dummy reference cell 242 and a second modified dummy reference cell 244. The first cell 242 includes an MTJ 161F, a transistor 168F and a first dummy resistor 246 with resistance $R_1$. The MTJ 161F is programmed to low resistance. The second cell 244 includes an MTJ 161G, a transistor 168G and a second dummy resistor 248. The MTJ 161G is programmed to high resistance. The outputs of the respective voltages are summed by a summing junction 250 to output a reference voltage $V_{REF}$.

Figure 14:
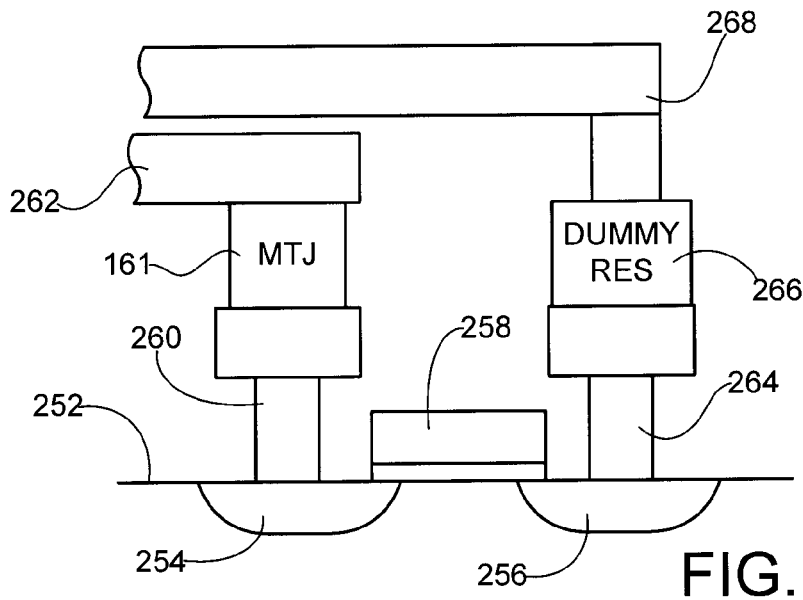
FIG. 14 is a side elevational depiction of an exemplary construction for a dummy cell in accordance with various embodiments of the present invention.

In the various embodiments presented above, it has been contemplated that the various dummy resistors are fabricated as fixed elements in each RSM cell. FIG. 14 provides an exemplary dummy reference cell construction configuration. A base substrate 252 has n+ doped regions 254, 256 and an isolated control gate region 258 to form the aforementioned transistor 168. A support structure 260 extends from the region 254 to support the MTJ 161, and a control line 262 is coupled to the MTJ 161 (such as a source line).

A second support structure 264 extends from the region 256 to support a resistive element 266 corresponding to the dummy resistor with resistance $R_A$. The resistive element 266 can take any number of suitable configurations, such as a thin film oxide. A second control line 268 extends from the resistor 266 (such as a bit line). It will be appreciated that the foregoing configuration is merely exemplary in nature, and any number of different configurations can readily be utilized as desired. For example, the resistive element 266 can alternatively be placed elsewhere in the structure, such as above the MTJ 161.

Figure 15:
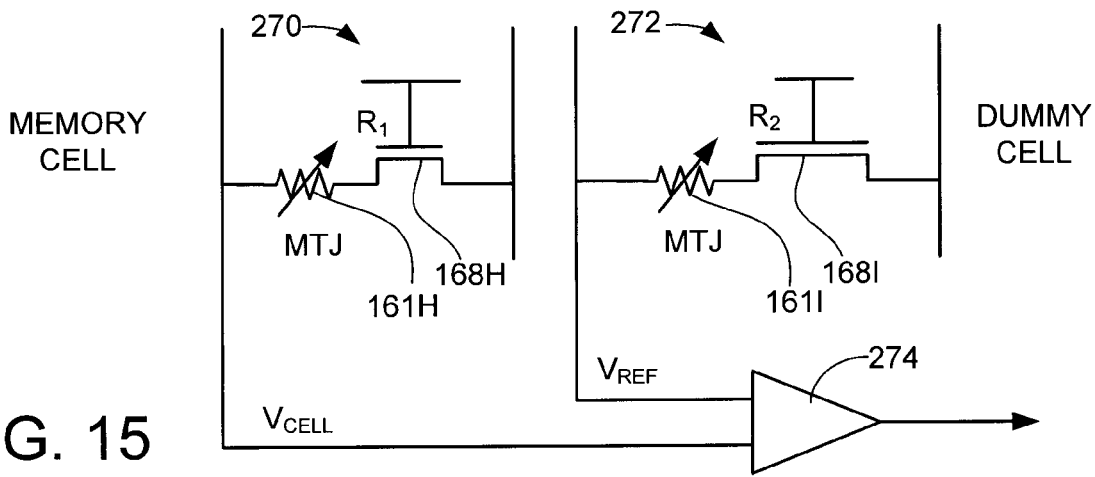
FIG. 15 is a schematic representation of a dummy reference cell and a memory cell in accordance with various embodiments.

FIG. 15 shows an alternative embodiment in which the dummy resistance does not necessarily constitute a separate passive element (such as a thin film oxide material), but rather is provided to the circuit through the use of different sizes of switching devices. In FIG. 15, a memory cell is denoted at 270 and a modified dummy cell is denoted at 272. The memory cell 270 includes MTJ 161H and switching device 168H. The dummy cell 272 includes MTJ 161I and switching device 168I. The dummy switching device (transistor) 168I is shown to be larger than the memory cell switching device (transistor) 168H. The dummy transistor 168I thus has a substantially lower forward bias resistance $R_2$ as compared to the resistance $R_1$ of the memory cell transistor 168H when both transistors are placed into conductive states.

By programming the dummy cell MTJ 161I to a high resistance state, the relative differences in the sizes of the respective transistors 168H, 168I can be selected such that $$R_{MIN\ MTJ} + R_{TR(LARGE\ R)} < R_{MAX\ MTJ} + R_{TR(SMALL\ R)} < R_{MAX\ MTJ} + R_{TR(LARGE\ R)} \qquad (10)$$

where $R_{MIN\ MTJ}$ is the nominal resistance of an MTJ programmed in the low resistance state; $R_{TR(LARGE\ R)}$ is the resistance $R_1$ of the "normal" sized transistors in the memory array; $R_{MAX\ MTJ}$ is the nominal resistance of an MTJ programmed in the high resistance state; and $R_{TR(SMALL\ R)}$ is the resistance $R_2$ of the "oversized" transistors in the dummy cells. Other embodiments are contemplated, such as the use of a smaller transistor in the modified dummy cells as compared to the normal sized transistors in the memory array and the programming of the MTJ in the dummy cells to a suitable value (such as logical 0).

Accordingly, the differently sized transistor 168I in FIG. 15 operates to supply both a switching device and a dummy resistor to the modified dummy cell 252, and the reference voltage $V_{REF}$ is set in relation to the selected resistive state of the MTJ resistive sense element (i.e., $R_{MAX}$) and the resistance of the dummy resistor (i.e., $R_2$).

In each of the foregoing embodiments, the resistance RA is substantially fixed. It will be appreciated, however, that the resistance RA can alternatively be made to be selectively programmable, such as through the use of one or more elements that are arrayed and configured to provide the desired resistance for the dummy reference cell. This can further be useful in adaptively adjusting a desired $V_{REF}$ level, and can compensate for other effects such as temperature, aging, etc. Moreover, while the respective switching device, MTJ and dummy resistor have been shown to be serially connected in each modified dummy reference cell, such is merely exemplary and not limiting, in that other arrangements can be readily used including but not limited to placement of the transistor in parallel with the MTJ and the dummy resistor.

The various embodiments presented herein have generally contemplated the storage of a single user data bit in each memory cell (e.g., cell 160A in FIG. 7) in relation to whether the storage state of the associated resistive sense element (RSE), such as the MTJ 161A, is relatively high or relatively low. Multiple bits, however, can be alternatively stored in each memory cell. For example, two bits can be stored if four resistive states can be established for the RSE element; that is, if separate resistances from low to high can be expressed as $R_1$, $R_2$, $R_3$ and $R_4$, then a two bit logical value "00" can be assigned to $R_1$, "01" assigned to $R_2$, "10" assigned to $R_3$ and "11" assigned to $R_4$. More generally, $2^N$ resistances can be used to store N bits of data in the memory cell.

In the foregoing example, three reference voltages of different magnitudes can be used to discern the respective programmed resistance of the memory cell. For example, a first $VREF_1$ can be used to sense whether the resistance of the memory cell is between $R_1$ and $R_2$; a second $VREF_2$ can be set to sense whether the resistance of the memory cell is between $R_2$ and $R_3$; and a third $VREF_3$ can be used to sense whether the resistance of the memory cell is between $R_3$ and $R_4$.

In such case, it will be appreciated that the respective reference voltages $VREF_1$, $VREF_2$ and $VREF_3$ generally need to be relatively precise to ensure correct reading takes place of the resistive state of the memory cell. In some embodiments, three different dummy reference cells are used with different RA values to generate the respective $VREF_1$, $VREF_2$ and $VREF_3$ reference voltages.

It will now be appreciated that the various embodiments presented herein provide various advantages over the prior art. The use of a dummy resistance in a dummy reference cell can result in significant reductions in variations in the reference voltage generated by the dummy cell. In some embodiments, a single dummy cell can be used to generate the associated reference voltage for a number of memory cells, eliminating the need to provide a pair of such dummy cells to generate the reference voltage (as in FIG. 7), thereby reducing areal overhead for the voltage generation by a factor of about 50%.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a dummy reference cell used to generate a reference voltage to sense a resistive state of a resistive sense memory (RSM) cell, the dummy reference cell comprising a switching device, a resistive sense element (RSE) programmed to a selected resistive state, and a dummy resistor coupled to the RSE, wherein a magnitude of the reference voltage is set in relation to the selected resistive state of the RSE and the resistance of the dummy resistor.

2. The apparatus of claim 1, wherein the dummy reference cell is connected between first and second control lines, and the dummy resistor is connected in series with the RSE between said control lines.

3. The apparatus of claim 2, wherein the reference voltage is presented on the second control line responsive to application of voltage to the first control line and generated in relation to a voltage drop across the dummy reference cell from the first control line to the second control line.

4. The apparatus of claim 1, further comprising a sense amplifier which compares the reference voltage to a cell voltage generated by the RSM cell.

5. The apparatus of claim 1, wherein the RSM cell and the dummy reference cell are incorporated into a semiconductor memory array, wherein the RSM cell is characterized as a first memory cell to store a first user bit in relation to the resistive state thereof, and wherein the dummy reference cell generates said reference voltage during a read operation to identify the first user bit.

6. The apparatus of claim 1, wherein the RSM cell is configured such that the resistive state of the RSM cell can alternatively take a relatively high first resistance or a relatively low second resistance, and wherein the RSE of the dummy reference cell is programmed to a selected one of said first resistance or second resistance.

7. The apparatus of claim 1, wherein the dummy reference cell is characterized as a first dummy reference cell with a first switching device, a first RSE, and a first dummy resistor with a first dummy resistance, and wherein the apparatus further comprises a second dummy reference cell coupled to the first dummy reference cell, the second dummy reference cell comprising a second switching device, a second RSE programmed to a selected resistive state, and a second dummy resistor coupled to the second RSE element.

8. The apparatus of claim 7, wherein the first RSE is programmed to a relatively low resistance, and wherein the second RSE is programmed to a relatively high resistance.

9. The apparatus of claim 7, wherein the first dummy resistor has a first resistance, and wherein the second dummy resistor has a second resistance different from the first resistance.

10. The apparatus of claim 1, wherein the RSM cell and the RSE of the reference cell each comprise a magnetic tunneling junction (MTJ).

11. A method comprising:
providing a dummy reference cell comprising a switching device, a resistive sense element (RSE) programmed to a first selected resistive state, and a dummy resistor coupled to the RSE;
passing a current through the dummy reference cell to generate a reference voltage, wherein a magnitude of the reference voltage is set in relation to the selected resistive state of the RSE and the resistance of the dummy resistor; and
using the reference voltage to sense a second selected resistive state of a resistive sense memory cell.

12. The method of claim 11, wherein the memory cell and the dummy reference cell are coupled to a common control line, and wherein the using step comprises asserting a voltage on the common control line to facilitate a flow of read currents through the respective memory cell and the dummy reference cell to generate a cell voltage and said reference voltage, respectively, and comparing the cell voltage to the reference voltage to sense the second selected resistive state of the memory cell.

13. The method of claim 11, wherein the dummy reference cell is connected between first and second control lines, wherein the dummy resistor is connected in series with the RSE between said control lines, and wherein the using step comprises applying a voltage to the first control line and generating the reference voltage on the second control line responsive to a voltage drop across the dummy reference cell from the first control line to the second control line.

14. The method of claim 11, wherein the using step comprises using the dummy reference cell to generate the reference voltage without using an additional second dummy reference cell to generate said reference voltage.

15. The method of claim 11, wherein the memory cell is configured such that the resistive state of the memory cell can alternatively take a relatively high first resistance or a relatively low second resistance, and wherein the RSE of the dummy reference cell is programmed to a selected one of said first resistance or second resistance.

16. The method of claim 11, wherein the dummy reference cell is characterized as a first dummy reference cell with a first switching device, a first RSE, and a first dummy resistor with a first dummy resistance, wherein the providing step further comprises providing a second dummy reference cell coupled to the first dummy reference cell, the second dummy reference cell comprising a second switching device, a second RSE programmed to a selected resistive state, and a second dummy resistor coupled to the second RSE element, and wherein the using step further comprises using both the first and second dummy reference cells to generate the reference voltage.

17. The method of claim 16, wherein the first dummy resistor has a first resistance, and wherein the second dummy resistor has a second resistance different from the first resistance.

18. The method of claim 11, wherein the dummy resistor is characterized as a resistance of the switching device of the dummy reference cell, and wherein the switching device of the dummy reference cell is sized to have a resistance that is different from a resistance of a switching device of the memory cell.

19. A semiconductor memory comprising:
an array of memory cells each comprising a programmable resistive sense element (RSE) in series with a switching device having a first overall size, each memory cell adapted to store a logical bit value in relation to a programmed state of its associated RSE; and
a dummy reference cell adapted to generate a reference voltage to sense the programmed state of each of a plurality of the memory cells in the array during a read operation upon the array, the dummy reference cell comprising a dummy reference cell programmable RSE in series with a dummy reference cell switching device having a second overall size selected to be larger or smaller than the first overall size so that the reference voltage is determined in relation to the programmed state of the dummy reference cell programmable RSE and a forward bias resistance of the dummy reference cell switching device.

20. The semiconductor memory of claim 19, in which the dummy reference cell switching device is larger than each of the respective switching devices of the plurality of memory cells so as to have a substantially lower forward bias resistance than the resistance of each of the respective switching devices of said plurality during activation thereof.

* * * * *